(12) United States Patent
Moon et al.

(10) Patent No.: US 10,297,305 B1
(45) Date of Patent: May 21, 2019

(54) MEMORY DEVICE HAVING TWIN CELL MODE AND REFRESH METHOD THEREOF

(71) Applicant: SK hynix Inc., Gyeonggi-do (KR)

(72) Inventors: Hong-Ki Moon, Seoul (KR); Jung-Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/968,276

(22) Filed: May 1, 2018

(30) Foreign Application Priority Data

Oct. 30, 2017 (KR) .................. 10-2017-0142533

(51) Int. Cl.
  *G11C 11/406* (2006.01)
  *G11C 29/00* (2006.01)

(52) U.S. Cl.
  CPC .......... *G11C 11/406* (2013.01); *G11C 29/783* (2013.01)

(58) Field of Classification Search
  CPC .................... G11C 11/406; G11C 29/783
  See application file for complete search history.

(56) References Cited

U.S. PATENT DOCUMENTS

| | | | |
|---|---|---|---|
| 2015/0162066 A1* | 6/2015 | Song | G11C 11/406 365/222 |
| 2015/0162071 A1* | 6/2015 | Yoon | G11C 11/4085 365/203 |
| 2016/0111140 A1* | 4/2016 | Joo | G11C 11/40611 365/222 |

FOREIGN PATENT DOCUMENTS

| | | |
|---|---|---|
| KR | 1020100054985 | 5/2010 |
| KR | 1020160119588 | 10/2016 |

* cited by examiner

*Primary Examiner* — Mohammed A Bashar
(74) *Attorney, Agent, or Firm* — IP & T Group LLP (57) ABSTRACT

A memory device includes: a memory region including a plurality of word lines; and a refresh control block configured to: sequentially refresh the plurality of word lines in a manner such that two or more word lines are simultaneously refreshed during a first refresh operation, simultaneously refresh two or more first critical word lines corresponding to a first critical address generated by up-counting a target address during a second refresh operation, and simultaneously refresh two or more second critical word lines corresponding to a second critical address generated by down-counting the target address.

21 Claims, 11 Drawing Sheets

MEMORY DEVICE HAVING TWIN CELL MODE AND REFRESH METHOD THEREOF

CROSS-REFERENCE TO RELATED APPLICATIONS

This application claims priority under 35 U.S.C. § 119 to Korean Patent Application No. 10-2017-0142533, filed on Oct. 30, 2017, in the Korean Intellectual Property Office, the disclosure of which is incorporated herein by reference in its entirety.

BACKGROUND

1. Field

Various exemplary embodiments of the present invention relate to a semiconductor design technique, and more particularly, to a memory device having a twin cell mode and a refresh method of the same.

2. Description of the Related Art

Each memory cell of a memory device generally includes a cell transistor functioning as a switch and a cell capacitor for storing charges (i.e., data). Whether data is in a 'high logic' level (i.e., logic '1') or a 'low logic' level (i.e., logic '0') is decided based on whether the cell capacitor included in the memory cell stores the charges or not, that is, whether a terminal voltage of the cell capacitor is high or low.

Since the retention of data signifies a state in which charges are accumulated in a cell capacitor, theoretically, power is not consumed in this state. However, due to a leakage current caused by a PN junction of a transistor, the initial amount of charges stored in a cell capacitor may be eventually vanish. Hence, the data stored in the cell capacitor may be lost. To protect the data from being lost, data in a memory cell has to be read before the data gets lost so as to produce read information, and then the cell capacitor has to be re-charged with the normal amount of charges according to the read information. This operation has to be repeated periodically to retain the data, and such a process for recharging cell charges is called a "refresh operation."

The refresh operation is performed whenever a refresh command is inputted into a memory from a memory controller. The memory controller inputs the refresh command to the memory with a predetermined time interval taking into consideration the data retention time of the memory. The data retention time may indicate the time capable of retaining data of a memory cell without the refresh operation. Since memory cells included in a memory device are designed to have the data retention time above a specific criterion, an interval of the refresh operation may be determined by considering such a criterion.

Meanwhile, when the amount of charges stored in a memory cell is affected by an active-precharge operation on a word line adjacent to a word line coupled to the memory cell, data of the memory cell may deteriorate in a shorter time than the interval of the refresh operation. This phenomenon is referred to as a row hammer phenomenon.

Figure 1:
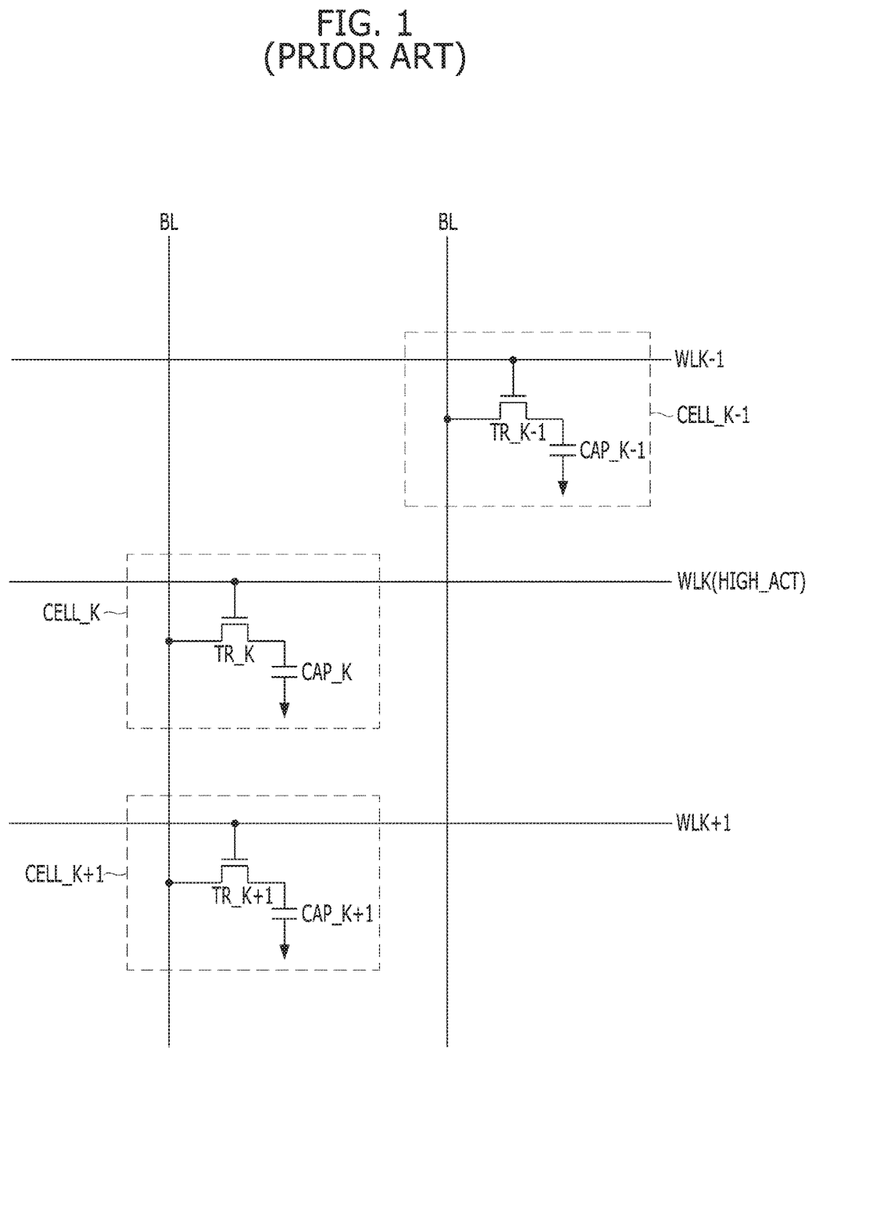
FIG. 1 is a diagram showing a part of a cell array included in a memory device to illustrate a row hammer phenomenon.

FIG. 1 is a diagram showing a part of a cell array included in a memory device to assist in the explanation of a row hammer phenomenon. The reference symbol BL designates bit lines.

Referring to FIG. 1, the reference symbols WLK−1, WLK and WLK+1 designate three word lines which are arranged in rows in a cell array. The word line WLK indicated by the reference symbol HIGH_ACT is a word line for which at least one of an activation count, activation frequency or activation time has a high value. The word lines WLK−1 and WLK+1 are disposed adjacent on either side of the word line WLK. The reference symbols CELL_K−1, CELL_K and CELL_K+1 designate memory cells coupled to the word lines WLK−1, WLK and WLK+1, respectively. The memory cells CELL_K−1, CELL_K and CELL_K+1 include respective cell transistors TR_K−1, TR_K and TR_K+1 and respective cell capacitors CAP_K−1, CAP_K and CAP_K+1.

In FIG. 1, when the word line WLK is activated many times, activated frequently or activated for a long time, a voltage of the word line WLK toggles frequently or has a high value for a long time. As a result, due to a coupling phenomenon occurring between the word line WLK and each of the word lines WLK−1 and WLK+1, influences may be exerted on data stored in the memory cells CELL_K−1 and CELL_K+1 coupled to the word lines WLK−1 and WLK+1. Such influences may reduce the retention time of these memory cells.

A memory device having a twin cell mode in which two memory cells are simultaneously selected to write and read the same data in order to increase the data retention time has been proposed. In the twin cell mode, since at least two memory cells are used at the same time, the chip density may be reduced but the capacity of a cell capacitor is doubled, and the data retention time may be also increased. Therefore, a system requiring high reliability of data can initiate the twin cell mode and simultaneously store the same data in a plurality of memory cells, whereby the reliability of data may be increased.

However, heretofore memory devices operating in a twin cell mode use generally inefficient refresh methods that do not adequately address the row hammer phenomenon. Hence, a refresh method capable of preventing a row hammer phenomenon in a memory device having in a twin cell mode would be highly desirable.

SUMMARY

Various embodiments of the present invention are directed to a refresh method capable of preventing a row hammer phenomenon in a memory device having a twin cell mode.

In accordance with an embodiment of the present invention, a memory device includes: a memory region including a plurality of word lines; and a refresh control block configured to: sequentially refresh the plurality of word lines in a manner such that two or more word lines are simultaneously refreshed during a first refresh operation, simultaneously refresh two or more first critical word lines corresponding to a first critical address generated by up-counting a target address during a second refresh operation, and simultaneously refresh two or more second critical word lines corresponding to a second critical address generated by down-counting the target address.

In accordance with an embodiment of the present invention, a memory device includes: a memory region including a plurality of word lines; a normal refresh control block configured to sequentially refresh the plurality of word lines in response to a normal refresh command, and simultaneously refresh two or more word lines when a twin cell mode signal is enabled; and a target refresh control block configured to refresh word lines adjacent to a target word line corresponding to a target address in response to a target refresh command, and refresh four or more word lines adjacent to two or more target word lines corresponding to the target address when the twin cell mode signal is enabled.

In accordance with an embodiment of the present invention, a refresh method of a memory device includes: sequentially refreshing a plurality of word lines in a manner such that two or more of the plurality of word lines are simultaneously refreshed during a first refresh operation; and simultaneously refreshing two or more first critical word lines corresponding to a first critical address generated by up-counting a target address and simultaneously refreshing two or more second critical word lines corresponding to a second critical address generated by down-counting the target address during a second refresh operation.

In accordance with an embodiment of the present invention, a memory device includes: a memory region including a plurality of word lines; a normal refresh control block configured to sequentially refresh the plurality of word lines in a manner that two or more word lines are simultaneously refreshed during a first refresh operation; and a target refresh control block configured to simultaneously refresh two or more first critical word lines corresponding to a first critical address generated by up-counting a target address, and simultaneously refresh two or more second critical word lines corresponding to a second critical address generated by down-counting the target address, during a second refresh operation.

These and other features and advantages of the present invention will become apparent to those with ordinary skill in the art to which the present invention belongs from the following description in conjunction with the accompanying drawings.

BRIEF DESCRIPTION OF THE DRAWINGS

FIGS. 7A to 8B are diagrams illustrating an operation of a target refresh control block shown in FIG. 6 in a twin cell mode.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 2:
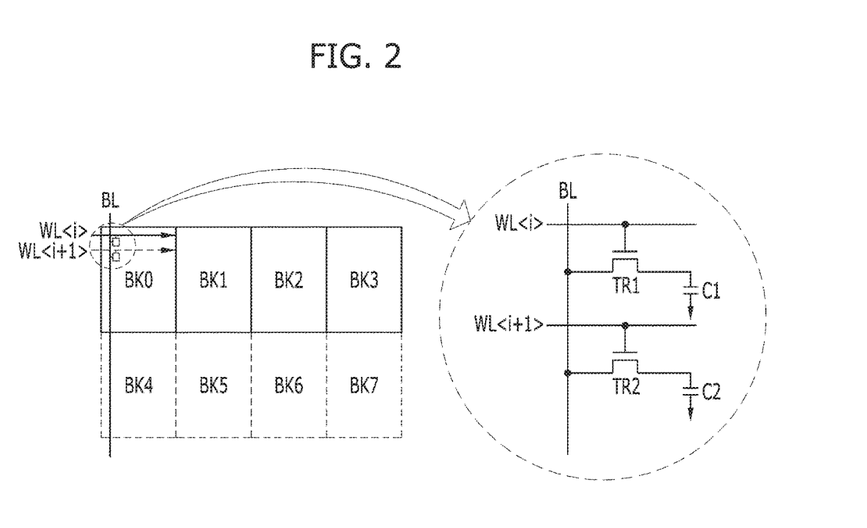
FIGS. 2 and 3 are diagrams illustrating a single cell mode and a twin cell mode of a memory device, respectively.
Figure 3:
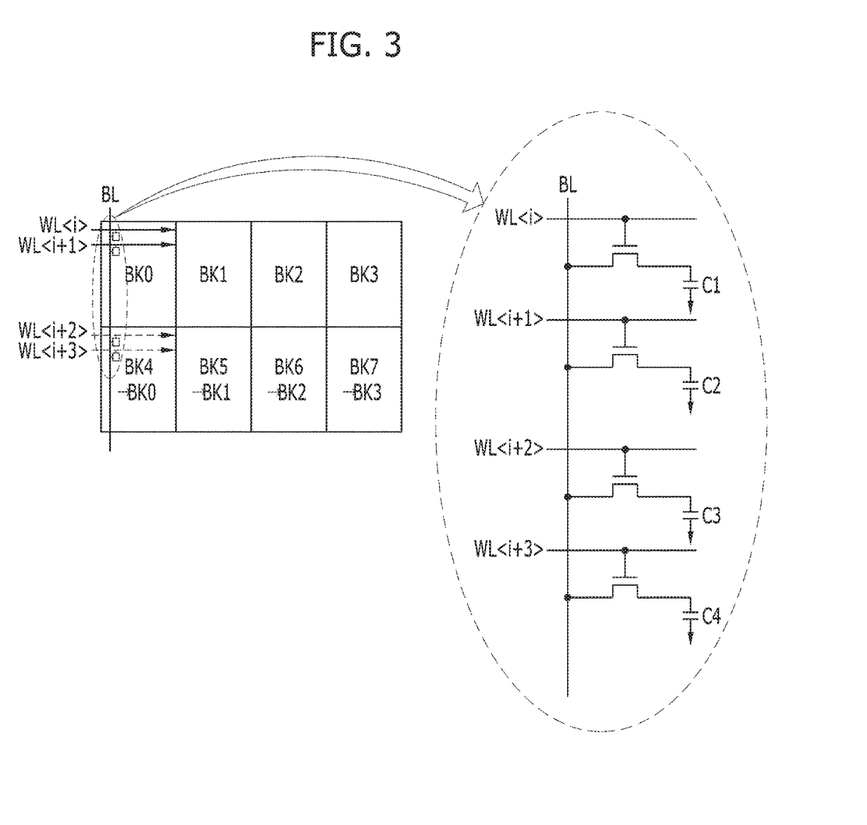

FIG. 2 is a diagram to assist in the explanation of a single cell mode of a memory device. FIG. 3 is a diagram to assist in the explanation of a twin cell mode of a memory device.

FIGS. 2 and 3 illustrate a memory device having eight banks BK0 to BK7 and descriptions are made on the basis of this structure for ease of reference. However, it is noted that a memory may be divided into various ways such as, for example, a bank, a page, a mat (MAT), etc. It is further noted that the memory device may be divided into various other ways and is not limited to the embodiments described in this document, and that the use area of the memory may be set according to various division methods. We also note that in FIGS. 2 and 3, the banks which are used are represented by solid lines, and the banks which are not used are represented by dotted lines.

Referring to FIG. 2, a half-chip structure in which only four banks BK0 to BK3 of the eight banks BK0 to BK7 are used in a double data rate 2 (DDR2) DRAM memory device is illustrated.

Each of a plurality of memory cells is arranged at cross points of word lines WL and bit lines BL, and one memory cell is composed of cell transistors TR1 and TR2 functioning as a switch and cell capacitors C1 and C2 storing charges (i.e., data). Data is divided into a 'high logic' level (logic 1) or a 'low logic' level (logic 0) depending on whether charges are present in the cell capacitor of the memory cell, that is, whether a terminal voltage of the cell capacitor is high or low.

Each of the word lines WL is accessed by different row addresses. For example, a word line WL<i> and a word line WL<i+1> may be accessed by row addresses that increase sequentially.

Therefore, when one word line WL<i> corresponding to a specific row address among the word lines WL is activated and one bit line BL is selected, data stored in a corresponding memory cell is sensed and amplified by a sense amplifier (not illustrated). In other words, when one word line and one bit line are selected, one memory cell is selected, and data is stored in the selected memory cell or the data stored in the selected memory cell is outputted.

Referring to FIG. 3, a twin cell mode in which four banks BK4 to BK7 which are not used in the half-chip structure are used in order to increase the amount of charges stored in the cell capacitor is illustrated.

In the twin cell mode, as two word lines WL<i> and WL<i+1> or WL<i+2> and WL<i+3> are controlled to be simultaneously activated and two cell capacitors C1 and C2 or C3 and C4 are used to store the same data, double data retention time may be secured theoretically. In order to control the two word lines WL<i> and WL<i+1> or WL<i+2> and WL<i+3> to be simultaneously activated, adjacent two word lines may be activated by processing a least significant bit (LSB) of the row address as "Don't care".

When two word lines WL<i> and WL<i+1> or WL<i+2> and WL<i+3> corresponding to a specific row address among the word lines WL are activated and one bit line BL is selected, data stored in corresponding memory cells is sensed and amplified by a sense amplifier (not illustrated). In other words, when two word lines and one bit line are selected, two memory cells are selected, and the same data is stored in the selected memory cells or the data stored in the selected memory cells is outputted. Generally, when the memory device is used for the purpose of requiring high reliability of data, the memory device is driven in the twin cell mode, and the same data is simultaneously stored in a plurality of memory cells, whereby the reliability of data may be increased.

A refresh operation of a memory device may be divided into a normal refresh operation and a target refresh operation. The normal refresh operation sequentially refreshes word lines by counting a refresh command inputted to the memory device. The target refresh operation addresses the row hammer phenomenon by refreshing word lines adjacent to a target word line corresponding to a target address. The target address may be a row address which is repeatedly accessed. The target word line may correspond to the target address, and the word lines adjacent to the target word line may be $(N-1)^{th}$ and $(N+1)^{th}$ word lines when the target word line is an $N^{th}$ word line.

Figure 4A:
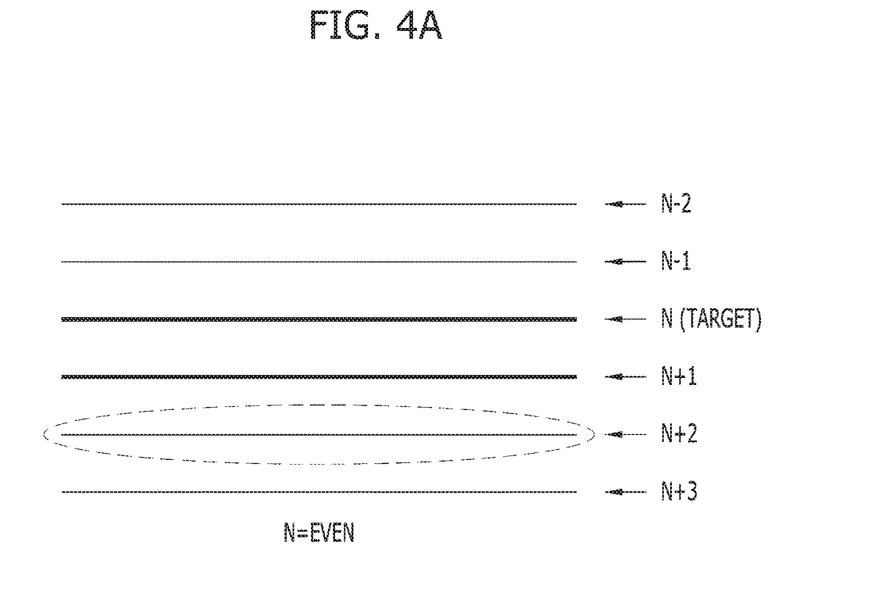
FIGS. 4A and 4B are diagrams illustrating a row hammer phenomenon in a memory device having a twin cell mode.
Figure 4B:
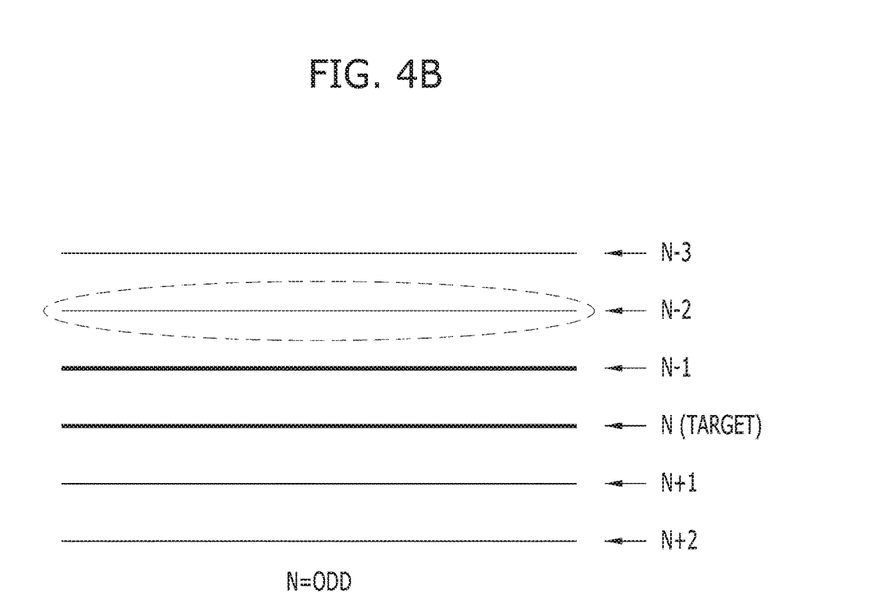

FIGS. 4A and 4B are diagrams to assist in the explanation of a row hammer phenomenon in a memory device having a twin cell mode.

Referring to FIG. 4A, in case of an even-number $N^{th}$ target word line, when a specific row address is inputted, the $N^{th}$ target word line corresponding to the specific row address and an adjacent $(N+1)^{th}$ word line are simultaneously accessed by processing a least significant bit (LSB) of the specific row address as "Don't care", Word lines that may be affected by the row hammer phenomenon by the $N^{th}$ target word line and the adjacent $(N+1)^{th}$ word line that are simultaneously accessed are the $(N-1)^{th}$ and $(N+2)^{th}$ word lines. However, because the $(N-1)^{th}$ and $(N+1)^{th}$ word lines adjacent to the $N^{th}$ target word line are target-refreshed, a conventional countermeasure against the row hammer phenomenon may not counteract the row hammer phenomenon occurring on the $(N+2)^{th}$ word line.

Referring to FIG. 4B, in case of an odd-number $N^{th}$ target word line, when a specific row address is inputted, the $N^{th}$ target word line corresponding to the specific row address and an adjacent $(N-1)^{th}$ word line are simultaneously accessed by processing a least significant bit (LSB) of the specific row address as "Don't care".

Word lines that may be affected by the row hammer phenomenon by the $N^{th}$ target word line and the adjacent $(N-1)^{th}$ word line that are simultaneously accessed are the $(N-2)^{th}$ and $(N+1)^{th}$ word lines. However, because the $(N-1)^{th}$ and $(N+1)^{th}$ word lines adjacent to the $N^{th}$ target word line are target-refreshed, a conventional countermeasure against the row hammer phenomenon may not counteract the row hammer phenomenon occurring on the $(N-2)^{th}$ word line.

Hereinafter, a refresh method of the memory device having the twin-cell mode for counteracting the row hammer phenomenon is described. In order to thoroughly explain a concept of the present invention, configurations related to a refresh operation of the memory device are mainly described.

Figure 5:
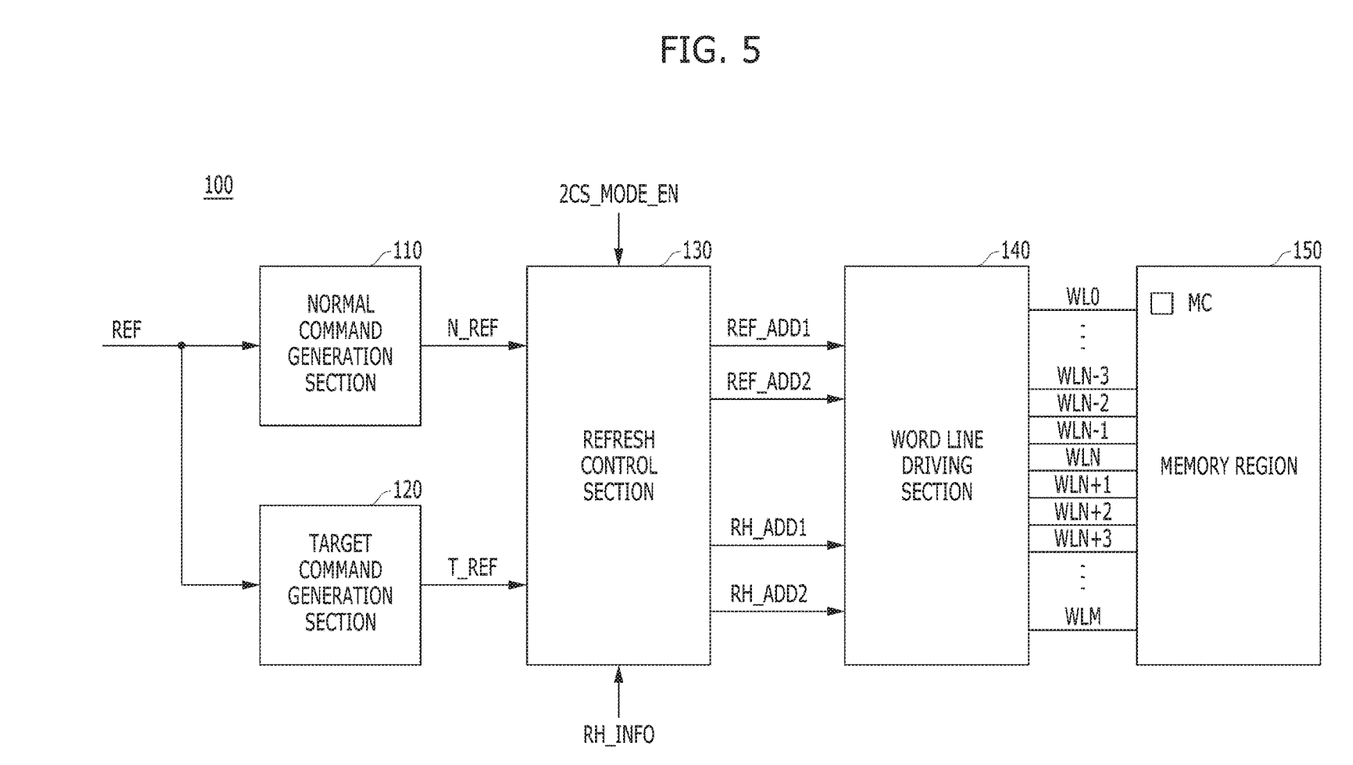
FIG. 5 is a block diagram illustrating a memory device having a twin cell mode in accordance with an embodiment of the present invention.

FIG. 5 is a block diagram illustrating a memory device 100 having a twin cell mode in accordance with an embodiment of the present invention.

Referring to FIG. 5, the memory device 100 may include a normal command generation section 110, a target command generation section 120, a refresh control section 130, a word line driving section 140, and a memory region 150.

The memory region 150 may include a plurality of banks (not illustrated), each having a plurality of memory cells MC. The memory region 150 may include a plurality of word lines WL0 to WLM coupled to the memory cells MC. The word lines WL0 to WLM may be designated by row addresses that increase sequentially. For the sake of convenience in description, FIG. 2 illustrates only the word lines and the memory cells.

The normal command generation section 110 may generate a normal refresh command N_REF in response to a refresh command REF, and the normal refresh command N_REF may be deactivated for each predetermined period. The target command generation section 120 may generate a target refresh command T_REF which is activated for each predetermined period in response to the refresh command REF. In other words, when the refresh command REF is inputted, the normal refresh command N_REF may be activated, and the target refresh command T_REF may be activated and the normal refresh command N_REF may be deactivated for each predetermined period.

The refresh control section 130 may generate a refresh address REF_ADD1 in response to the normal refresh command N_REF so that the word lines WL0 to WLM are sequentially refreshed. In addition, the refresh control section 130 may generate a refresh address RH_ADD1 in response to the target refresh command T_REF so that word lines adjacent to a target word line corresponding to a target address (not illustrated) are refreshed. The refresh control section 130 may receive row hammer information RH_INFO to generate the target address.

When a twin cell mode signal 2CS_MODE_EN is enabled, the refresh control section 130 may initiate a twin cell mode. In operation in the twin cell mode, the refresh control section 130 may generate the refresh addresses REF_ADD1 and REF_ADD2 in response to the normal refresh command N_REF so that the word lines WL0 to WLM are sequentially refreshed in such a way as to simultaneously refresh two or more word lines. In addition, the refresh control section 130 may generate the refresh addresses RH_ADD1 and RH_ADD2 in response to the target refresh command T_REF so that four or more word lines adjacent to the two or more target word lines corresponding to the target address are also refreshed.

More specifically, the refresh control section 130 may process a least significant bit (LSB) of a first critical address (not illustrated), which is generated by up-counting the target address, as "Don't care", to output as the refresh addresses RH_ADD1 and RH_ADD2, and process a least significant bit (LSB) of a second critical address (not illustrated), which is generated by down-counting the target address, as "Don't care", to output as the refresh addresses RH_ADD1 and RH_ADD2. Advisably, the refresh control section 130 may generate the first critical address by up-counting the target address by 2 and generate the second critical address by down-counting the target address by 2.

The word line driving section 140 may activate word lines which correspond to the refresh addresses REF_ADD1, REF_ADD2, RH_ADD1 and RH_ADD2 outputted from the refresh control section 130.

Figure 6:
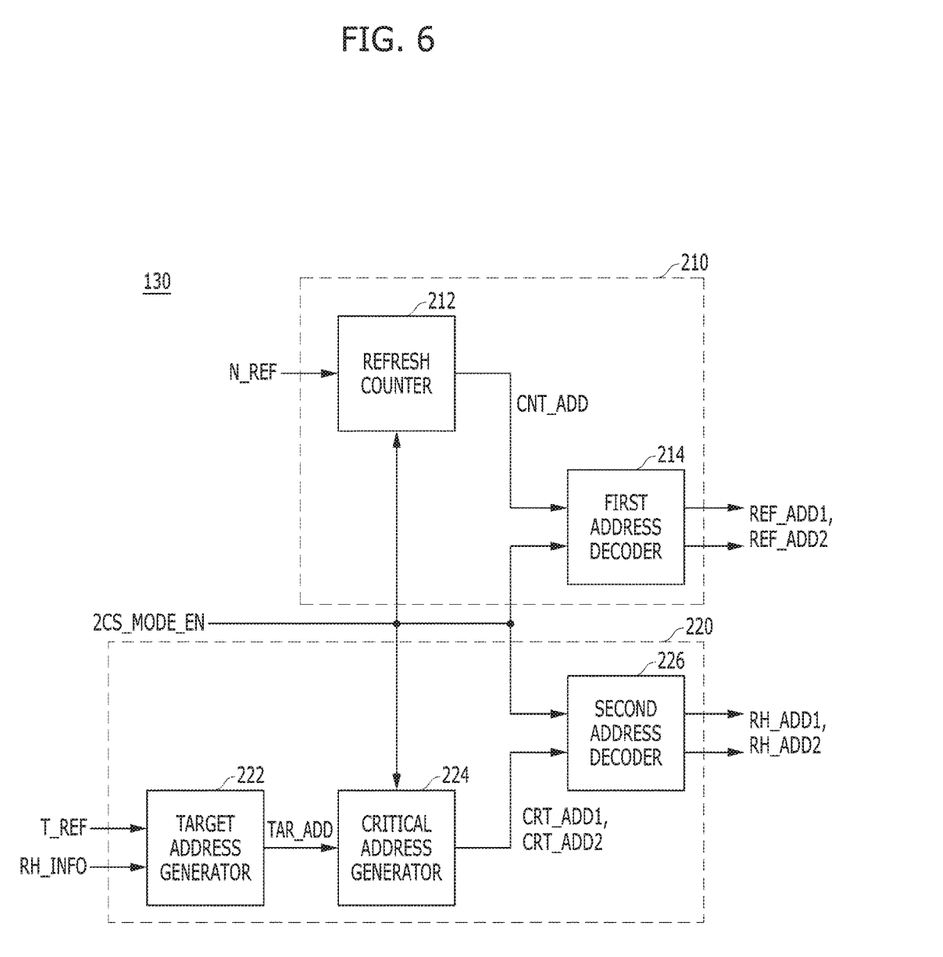
FIG. 6 is a block diagram illustrating an exemplary configuration of a refresh control section shown in FIG. 5.

FIG. 6 is a block diagram illustrating an exemplary configuration of the refresh control section 130 shown in FIG. 5.

Referring to FIG. 6, the refresh control section 130 may include a normal refresh control block 210 and a target refresh control block 220.

The normal refresh control block 210 may generate the refresh address REF_ADD1 in response to the normal refresh command N_REF so that the word lines WL0 to WLM are sequentially refreshed, but when the twin cell mode signal 2CS_MODE_EN is enabled, the normal refresh control block 210 may generate the refresh addresses REF_ADD1 and REF_ADD2 so that two or more word lines are simultaneously refreshed.

More specifically, the normal refresh control block 210 may include a refresh counter 212 and a first address decoder 214.

The refresh counter 212 may up-count the normal refresh command N_REF by 1 to generate a counting address CNT_ADD. However, when the twin cell mode signal 2CS_MODE_EN is enabled, the refresh counter 212 may up-count the normal refresh command N_REF by 2 to generate the counting address CNT_ADD. The first address decoder 214 may decode the counting address CNT_ADD to generate the refresh address REF_ADD1. However, when the twin cell mode signal 2CS_MODE_EN is enabled, the first address decoder 214 may process a least significant bit (LSB) of the refresh address REF_ADD1 as "Don't care" to output as the refresh addresses REF_ADD1 and REF_ADD2.

The target refresh control block 220 may generate the refresh address RH_ADD1 in response to the target refresh command T_REF so that the word lines adjacent to the target word line corresponding to a target address TAR_ADD are refreshed. However, when the twin cell mode signal 2CS_MODE_EN is enabled, the target refresh control block 220 may generate the refresh addresses RH_ADD1 and RH_ADD2 so that four or more word lines adjacent to two or more target word lines corresponding to the target address TAR_ADD are refreshed.

More specifically, the target refresh control block 220 may include a target address generator 222, a critical address generator 224, and a second address decoder 226.

The target address generator 222 may generate the target address TAR_ADD corresponding to the row hammer information RH_INFO in response to the target refresh command T_REF. The row hammer information RH_INFO may include information on the row address that is frequently accessed. According to the embodiment, the target address generator 222 may receive address information including a bank address and a row address and an active command, and determine a specific row address as the target address TAR_ADD when an active count of the row address exceeds a threshold value.

The critical address generator 224 may up/down-count the target address TAR_ADD by 1. However, when the twin cell mode signal 2CS_MODE_EN is enabled, the critical address generator 224 may generate first and second critical addresses CRT_ADD1 and CRT_ADD2 by up/down-counting the target address TAR_ADD by 2.

The second address decoder 226 may decode the first and second critical addresses CRT_ADD1 and CRT_ADD2 to generate the refresh address RH_ADD1. When the twin cell mode signal 2CS_MODE_EN is enabled, the second address decoder 226 may process a least significant bit (LSB) of the refresh address RH_ADD1 as "Don't care" to output as the refresh addresses RH_ADD1 and RH_ADD2.

Figure 7A:
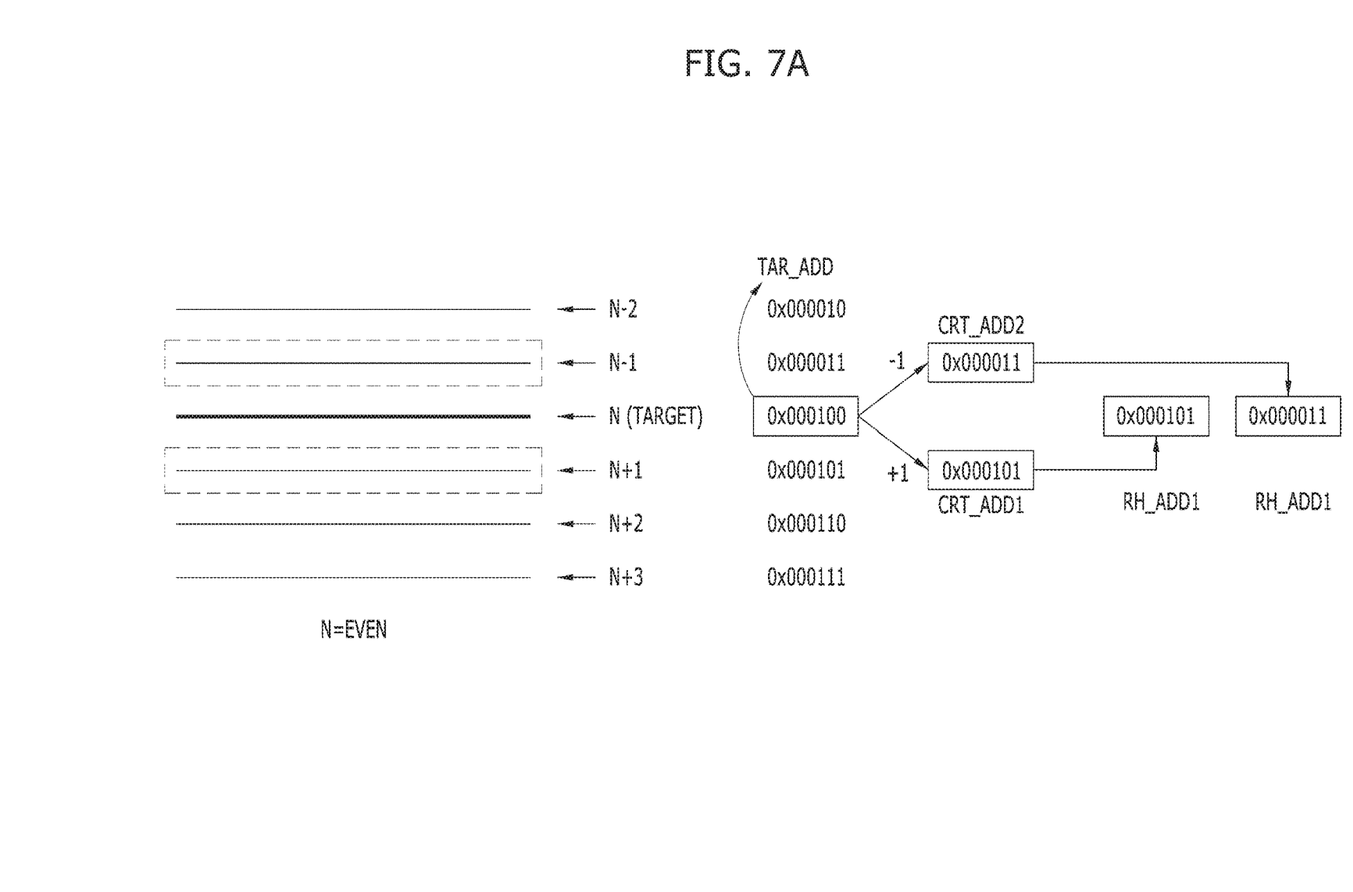
Figure 7B:
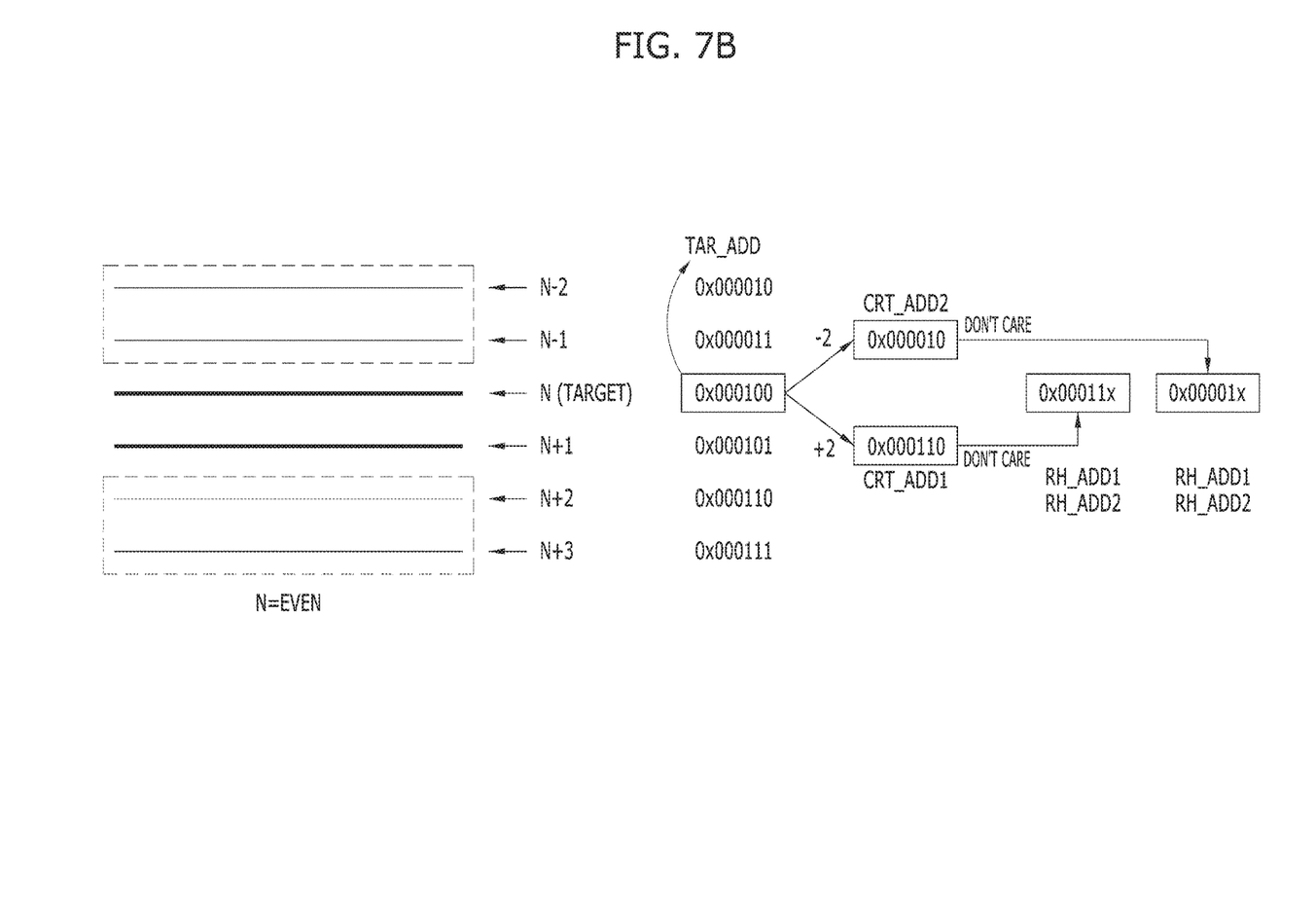

FIGS. 7A and 7B are diagrams to assist in the explanation of an operation of the target refresh control block 220. FIGS. 7A and 7B illustrate a case where an $N^{th}$ target word line corresponding to the target address TAR_ADD of "0x000100" is even-numbered.

Referring to FIG. 7A, in the single cell mode, the critical address generator 224 may generate the first critical address CRT_ADD1 of "0x000101" and the second critical address CRT_ADD2 of "0x000011" by up/down-counting the target address TAR_ADD by 1, and the second address decoder 226 may decode the first and second critical addresses CRT_ADD1 and CRT_ADD2 to sequentially output as the refresh address RH_ADD1. For the sake of convenience in description, when it is assumed that results before and after the decoding operation are the same, the refresh address RH_ADD1 may be sequentially outputted as the addresses of "0x000101" and "0x000011." Therefore, an $(N+1)^{th}$ target word line corresponding to the refresh address RH_ADD1 of "0x000101" may be refreshed, and an $(N-1)^{th}$ target word line corresponding to the refresh address RH_ADD1 of "0x000011" may be refreshed.

Referring to FIG. 7B, in the twin cell mode, the critical address generator 224 may generate the first critical address CRT_ADD1 of "0x000110" and the second critical address CRT_ADD2 of "0x000010" by up/down-counting the target address TAR_ADD by 2, and the second address decoder 226 may decode the first and second critical addresses CRT_ADD1 and CRT_ADD2 to generate the refresh address RH_ADD1, and process the least significant bit (LSB) of the refresh address RH_ADD1 as "Don't care" to output as the refresh addresses RH_ADD1 and RH_ADD2. For the sake of convenience in description, when it is assumed that results before and after the decoding operation are the same, the refresh addresses RH_ADD1 and RH_ADD2 may be outputted as "0x00011x", i.e., "0x000110" and "0x000111" in advance, and subsequently as "0x00001x", i.e., "0x000010" and "0x000011." Therefore, an $(N+2)^{th}$ target word line and an $(N+3)^{th}$ target word line respectively corresponding to the refresh address RH_ADD1 of "0x000110" and the refresh address RH_ADD2 of "0x000111" may be simultaneously refreshed, and an $(N-2)^{th}$ target word line and the $(N-1)^{th}$ target word line respectively corresponding to the refresh address RH_ADD1 of "0x000010" and the refresh address RH_ADD2 of "0x000011" may be simultaneously refreshed. Consequently, in the twin cell mode, the $(N+2)^{th}$ word line affected by the row hammer phenomenon may be target-refreshed.

Figure 8A:
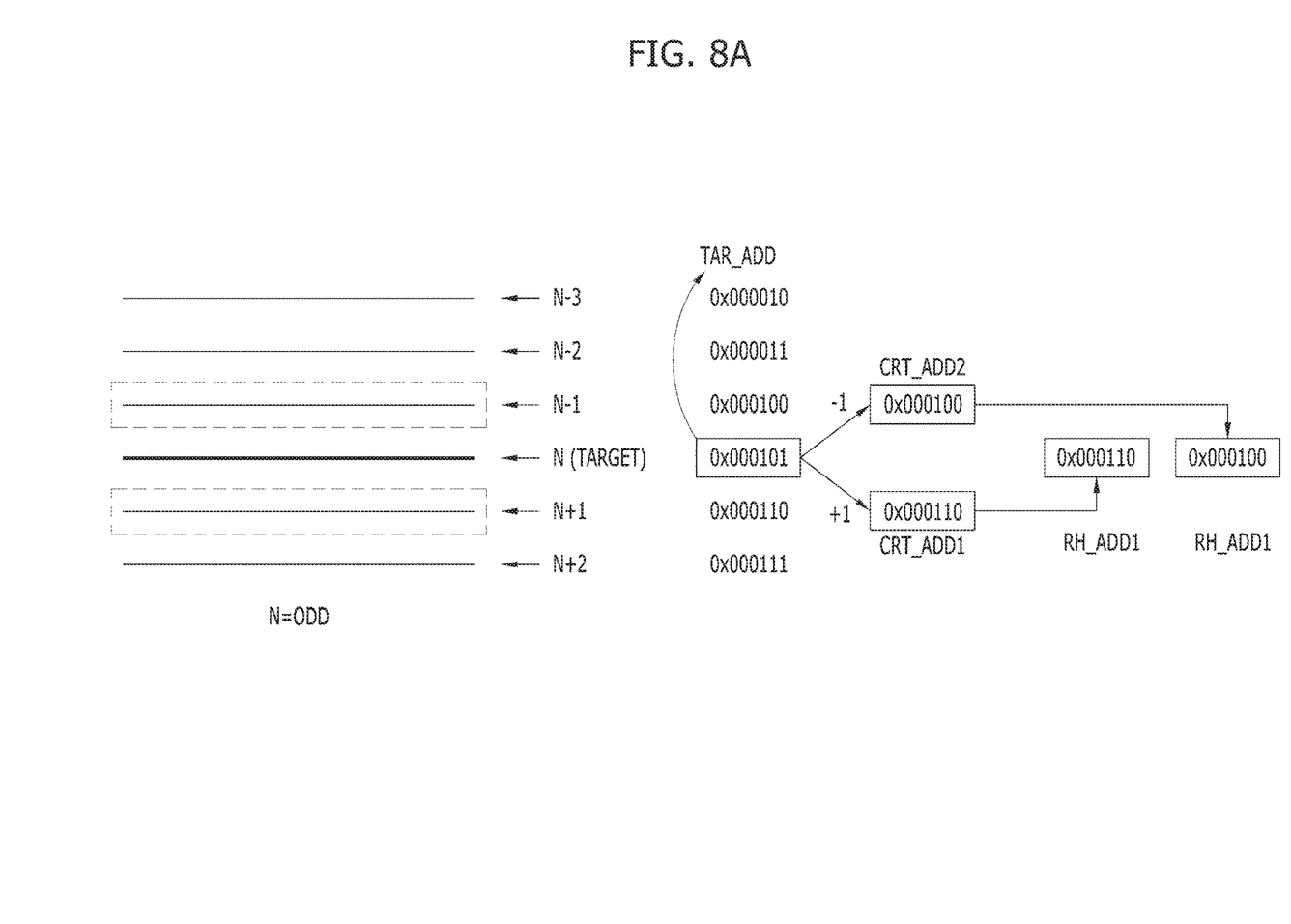
Figure 8B:
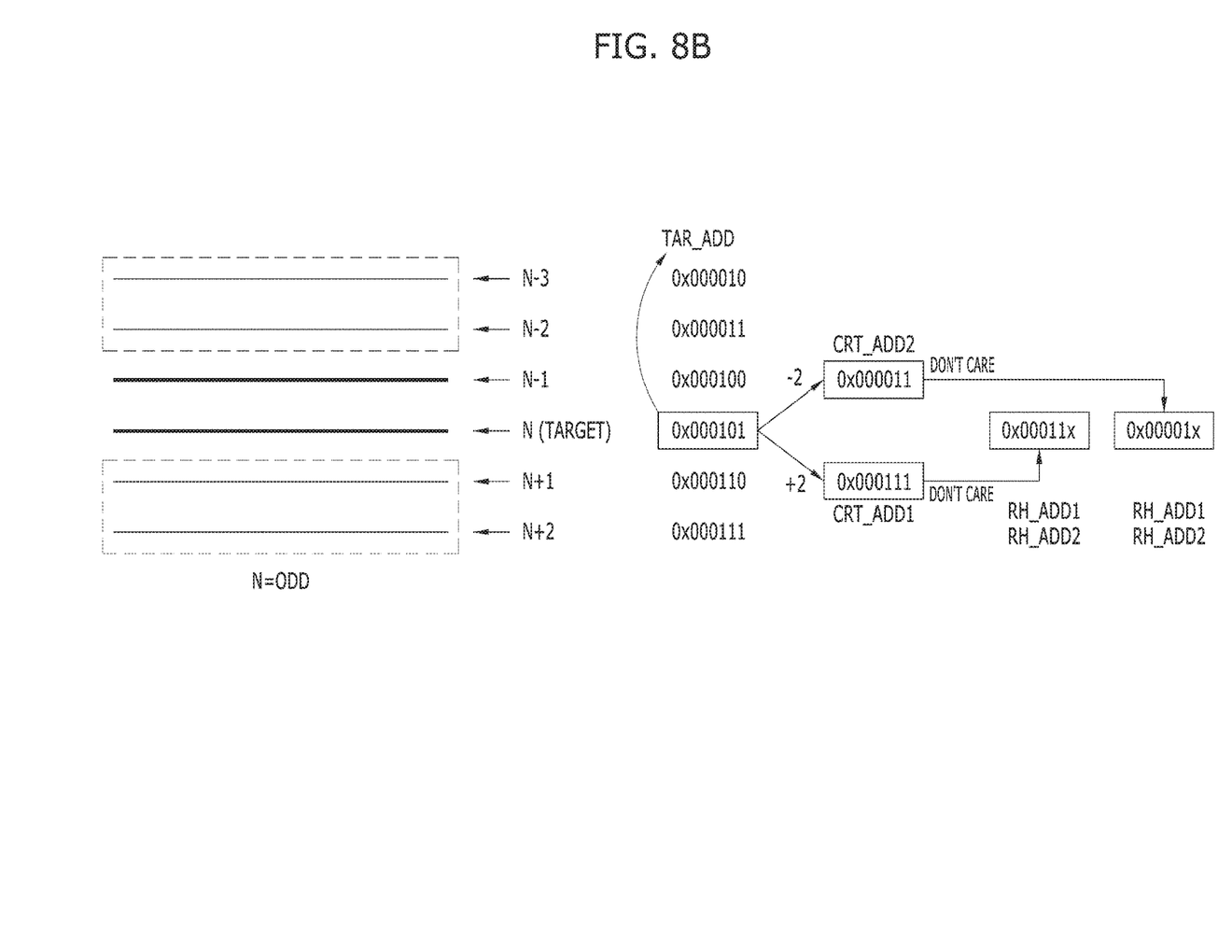

FIGS. 8A and 8B are diagrams to assist in the explanation of an operation of the target refresh control block 220 shown in FIG. 6. FIGS. 8A and 8B illustrate a case where an $N^{th}$ target word line corresponding to the target address TAR_ADD of "0x000101" is odd-numbered.

Referring to FIG. 8A, in the single cell mode, the critical address generator 224 may generate the first critical address CRT_ADD1 of "0x000110" and the second critical address CRT_ADD2 of "0x000100" by up/down-counting the target address TAR_ADD by 1, and the second address decoder 226 may decode the first and second critical addresses CRT_ADD1 and CRT_ADD2 to sequentially output as the refresh address RH_ADD1. For the sake of convenience in description, when it is assumed that results before and after the decoding operation are the same, the refresh address RH_ADD1 may be sequentially outputted as the addresses of "0x000110" and "0x000100." Therefore, an $(N+1)^{th}$ target word line corresponding to the refresh address RH_ADD1 of "0x000110" may be refreshed, and an $(N-1)^{th}$ target word line corresponding to the refresh address RH_ADD1 of "0x000100" may be refreshed.

Referring to FIG. 8B, in the twin cell mode, the critical address generator 224 may generate the first critical address CRT_ADD1 of "0x000111" and the second critical address CRT_ADD2 of "0x000011" by up/down-counting the target address TAR_ADD by 2, respectively, and the second address decoder 226 may decode the first and second critical addresses CRT_ADD1 and CRT_ADD2 to generate the refresh address RH_ADD1, and process the least significant bit (LSB) of the refresh address RH_ADD1 as "Don't care" to output as the refresh addresses RH_ADD1 and RH_ADD2. For the sake of convenience in description, when it is assumed that results before and after the decoding operation are the same, the refresh addresses RH_ADD1 and RH_ADD2 may be outputted as "0x00011x", i.e., "0x000110" and "0x000111" in advance, and subsequently as "0x00001x", i.e., "0x000010" and "0x000011." Therefore, the $(N+1)^{th}$ target word line and an $(N+2)^{th}$ target word line respectively corresponding to the refresh address RH_ADD1 of "0x000110" and the refresh address RH_ADD2 of "0x000111" may be simultaneously refreshed, and an $(N-3)^{th}$ target word line and an $(N-2)^{th}$ target word line respectively corresponding to the refresh address RH_ADD1 of "0x000010" and the refresh address RH_ADD2 of "0x000011" may be simultaneously refreshed. Consequently, in the twin cell mode, the $(N-2)^{th}$ word line affected by the row hammer phenomenon may be target-refreshed.

Although FIGS. 7A and 7B illustrate a case where results obtained by up/down-counting the target address TAR_ADD are generated as the first critical address CRT_ADD1 and the second critical address CRT_ADD2, respectively, the generation order may be adjusted according to embodiments.

Hereinafter, a refresh method of a memory device in accordance with an embodiment of the present invention is described with reference to FIGS. 5 to 9B.

Figure 9A:
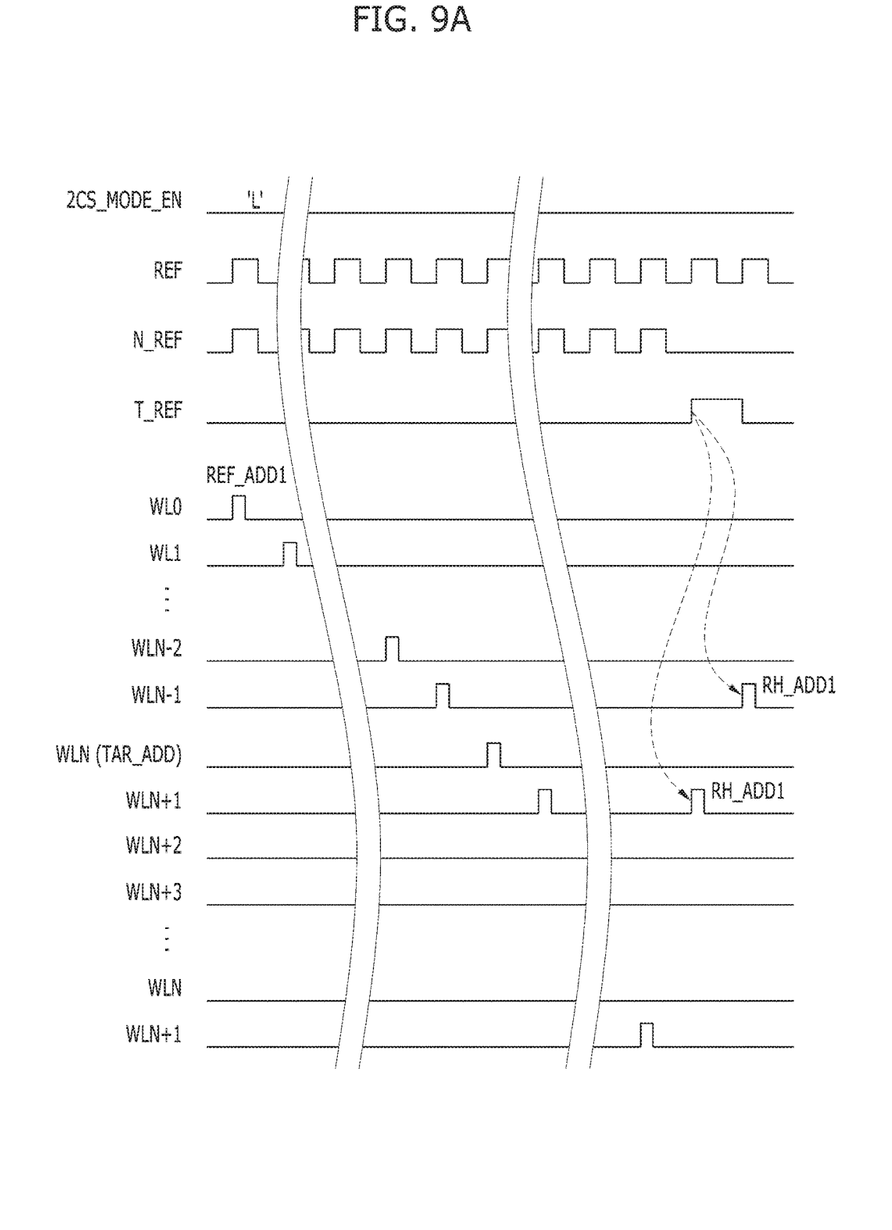
FIGS. 9A and 9B are diagrams illustrating a refresh method of a memory device having a twin cell mode in accordance with an embodiment of the present invention.
Figure 9B:
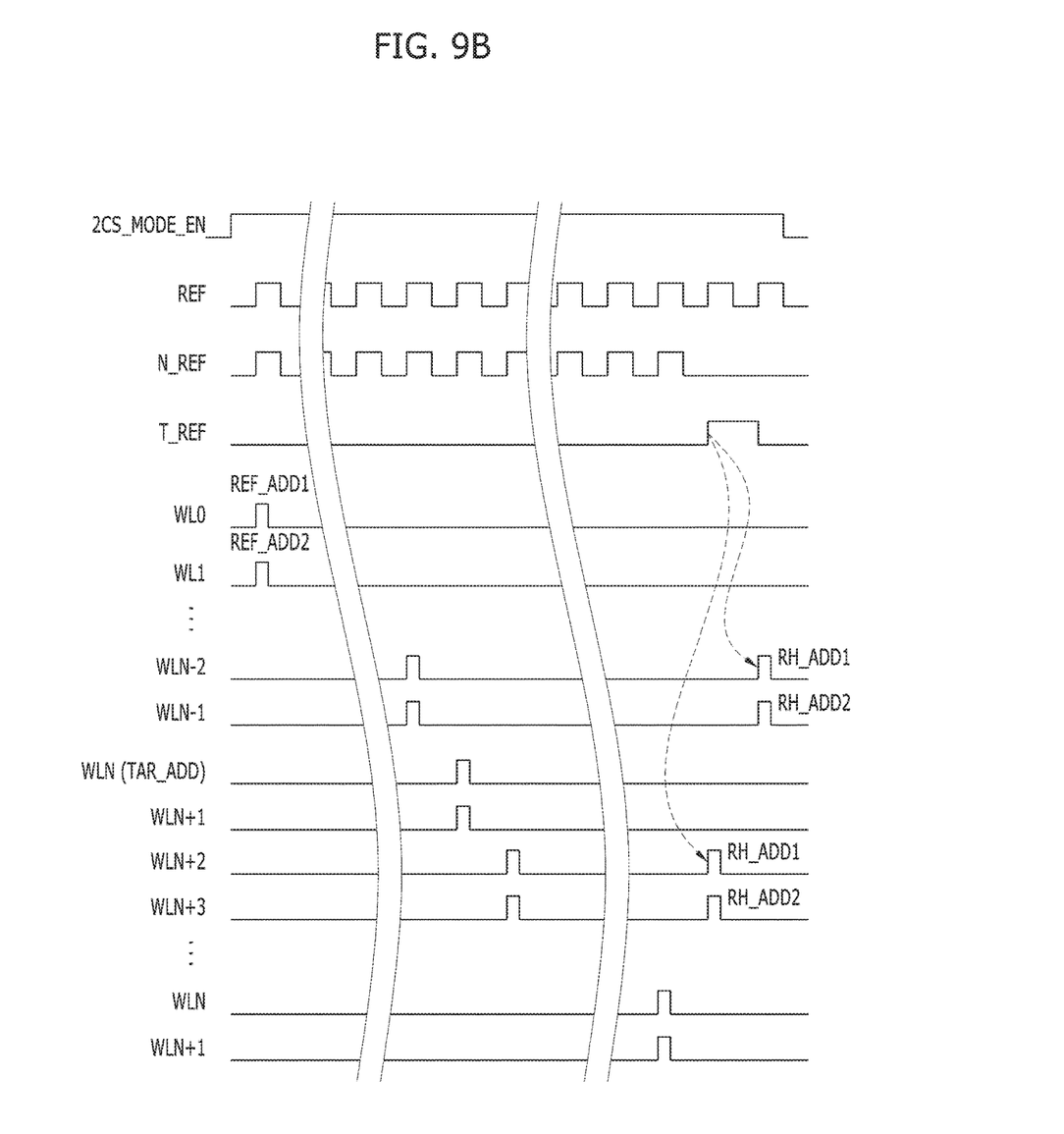

FIGS. 9A and 9B are diagrams to assist in the explanation of the refresh method of the memory device having the twin cell mode in accordance with an embodiment of the present invention.

FIG. 9A illustrates the refresh method of the memory device 100 in the single cell mode, i.e., when the twin cell mode signal 2CS_MODE_EN is disabled.

The normal command generation section 110 may generate the normal refresh command N_REF in response to the refresh command REF, and the normal refresh command N_REF may be deactivated for each predetermined period. The target command generation section 120 may generate the target refresh command T_REF which is activated for the each predetermined period in response to the refresh command REF.

The normal refresh control block 210 may generate the refresh address REF_ADD1 in response to the normal refresh command N_REF so that the word lines WL0 to WLM are sequentially refreshed.

The target refresh control block 220 may generate the refresh address RH_ADD1 in response to the target refresh command T_REF so that the word lines adjacent to the target word line corresponding to the target address TAR_ADD are refreshed. For example, when the target word line is an $N^{th}$ word line WLN, an $(N+1)^{th}$ word line WLN+1 and an $(N-1)^{th}$ word line WLN-1 may be sequentially refreshed.

Referring to FIG. 9B, the refresh method of the memory device 100 is illustrated in the twin cell mode, i.e., when the twin cell mode signal 2CS_MODE_EN is enabled.

The normal refresh control block 210 may generate the refresh addresses REF_ADD1 and REF_ADD2 in response to the normal refresh command N_REF so that two or more word lines are simultaneously refreshed. For example, when the target word line is an $N^{th}$ word line WLN and the $N^{th}$ target word line is even-numbered, the $N^{th}$ target word line and an $(N+1)^{th}$ word line WLN+1 may be simultaneously refreshed.

The target refresh control block 220 may generate the refresh addresses RH_ADD1 and RH_ADD2 in response to the target refresh command T_REF so that four or more word lines adjacent to two or more target word lines corresponding to the target address TAR_ADD are refreshed. For example, the target refresh control block 220 may generate the refresh addresses RH_ADD1 and RH_ADD2 so that an $(N+2)^{th}$ word line WLN+2 and an $(N+3)^{th}$ word line WLN+3 are simultaneously refreshed and an $(N-1)^{th}$ word line WLN-1 and an $(N-2)^{th}$ word line WLN-2 are simultaneously refreshed.

As described above, the $(N+2)^{th}$ word line WLN+2, which is impossible to counteract the row hammer phenomenon in a conventional refresh scheme when the $N^{th}$ target word line is even-numbered, and the $(N-2)^{th}$ word line WLN-2, which is impossible to counteract the row hammer phenomenon in the conventional refresh scheme when the $N^{th}$ target word line is odd-numbered, may be target-refreshed, whereby the row hammer phenomenon may be prevented in the memory device having the twin cell mode.

As is apparent from the above descriptions, in the memory device in accordance with the embodiments of the present invention, the efficiency of the refresh operation in the twin cell mode may be improved, and the reliability of data stored in the memory device may be secured by preventing the data from being lost.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

Also, dispositions and types of the logic gates and transistors described in the aforementioned embodiments may be implemented differently based on the polarity of the inputted signal.

What is claimed is:

1. A memory device comprising:
   a memory region including a plurality of word lines; and
   a refresh control block configured to:
   sequentially refresh the plurality of word lines in a manner such that two or more word lines are simultaneously refreshed during a first refresh operation,
   simultaneously refresh two or more first critical word lines corresponding to a first critical address generated by up-counting a target address during a second refresh operation, and
   simultaneously refresh two or more second critical word lines corresponding to a second critical address generated by down-counting the target address.

2. The memory device of claim 1, wherein the refresh control block is configured to generate the first critical address by up-counting the target address by 2 and generate the second critical address by down-counting the target address by 2.

3. The memory device of claim 2, wherein the refresh control block is configured to simultaneously refresh the first critical word lines respectively corresponding to addresses generated by processing a least significant bit (LSB) of the first critical address as "Don't care".

4. The memory device of claim 2, wherein the refresh control block is configured to simultaneously refresh the second critical word lines respectively corresponding to addresses generated by processing a least significant bit (LSB) of the second critical address as "Don't care".

5. The memory device of claim 1, wherein the refresh control block is configured to simultaneously refresh the word lines respectively corresponding to the addresses generated by processing a least significant bit (LSB) of a counting address generated by up-counting a refresh command by 2 during the first refresh operation.

6. A memory device comprising:
a memory region including a plurality of word lines;
a normal refresh control block configured to sequentially refresh the plurality of word lines in response to a normal refresh command, and simultaneously refresh two or more word lines when a twin cell mode signal is enabled; and
a target refresh control block configured to refresh word lines adjacent to a target word line corresponding to a target address in response to a target refresh command, and refresh four or more word lines adjacent to two or more target word lines corresponding to the target address when the twin cell mode signal is enabled.

7. The memory device of claim 6, wherein when the twin cell mode signal is enabled, the target refresh control block is configured to simultaneously refresh two or more first critical word lines corresponding to a first critical address generated by up-counting the target address and simultaneously refreshes two or more second critical word lines corresponding to a second critical address generated by down-counting the target address.

8. The memory device of claim 7, wherein the target refresh control block is configured to generate the first critical address by up-counting the target address by 2 and generates the second critical address by down-counting the target address by 2.

9. The memory device of claim 7, wherein the target refresh control block is configured to simultaneously refresh the first critical word lines respectively corresponding to addresses generated by processing a least significant bit (LSB) of the first critical address as "Don't care".

10. The memory device of claim 7, wherein the target refresh control block is configured to simultaneously refresh the second critical word lines respectively corresponding to addresses generated by processing a least significant bit (LSB) of the second critical address as "Don't care".

11. The memory device of claim 6, wherein the normal refresh control block includes:
a refresh counter configured to up-count the normal refresh command by 1 but up-counting the normal refresh command by 2 when the twin cell mode signal is enabled so as to generate the counting address; and
a first address decoder configured to decode the counting address to generate a refresh address, and outputting the refresh address by processing a least significant bit (LSB) of the refresh address as "Don't care" when the twin cell mode signal is enabled.

12. The memory device of claim 6, wherein the target refresh control block includes:
a target address generator configured to generate the target address based on row hammer information in response to the target refresh command;
a critical address generator configured to generate the first and second critical addresses by up/down-counting the target address by 1 but up/down-counting the target address by 2 when the twin cell mode signal is enabled; and
a second address decoder configured to decode the first and second critical addresses to generate a refresh address, and outputting the refresh address by processing a least significant bit (LSB) of the refresh address as "Don't care" when the twin cell mode signal is enabled.

13. The memory device of claim 6, further comprising:
a normal command generator configured to generate the normal refresh command in response to a refresh command, wherein the normal refresh command is deactivated for each predetermined period; and
a target command generator configured to generate the target refresh command which is activated for the each predetermined period in response to the refresh command.

14. A refresh method of a memory device, comprising:
sequentially refreshing a plurality of word lines in a manner such that two or more of the plurality of word lines are simultaneously refreshed during a first refresh operation; and
simultaneously refreshing two or more first critical word lines corresponding to a first critical address generated by up-counting a target address and simultaneously refreshing two or more second critical word lines corresponding to a second critical address generated by down-counting the target address during a second refresh operation.

15. The refresh method of claim 14, wherein during the second refresh operation, the first critical address is generated by up-counting the target address by 2, and the second critical address is generated by down-counting the target address by 2.

16. The refresh method of claim 15, wherein during the second refresh operation, the first critical word lines respectively corresponding to addresses generated by processing a least significant bit (LSB) of the first critical address as "Don't care" are simultaneously refreshed.

17. The refresh method of claim 15, wherein during the second refresh operation, the second critical word lines respectively corresponding to addresses generated by processing a least significant bit (LSB) of the second critical address as "Don't care" are simultaneously refreshed.

18. The refresh method of claim 14, wherein during the first refresh operation, the word lines respectively corresponding to addresses generated by processing a least significant bit (LSB) of a counting address which is generated by up-counting a refresh command by 2, as "Don't care", are simultaneously refreshed.

19. A memory device comprising:
a memory region including a plurality of word lines;
a normal refresh control block configured to sequentially refresh the plurality of word lines in a manner that two or more word lines are simultaneously refreshed during a first refresh operation; and a target refresh control block configured to simultaneously refresh two or more first critical word lines corresponding to a first critical address generated by up-counting a target address, and simultaneously refresh two or more second critical word lines corresponding to a second critical address generated by down-counting the target address, during a second refresh operation.

20. The memory device of claim 19, wherein the target refresh control block is configured to generate the first critical address by up-counting the target address by 2 and generates the second critical address by down-counting the target address by 2.

21. The memory device of claim 20,
wherein the target refresh control block is configured to simultaneously refreshes the first critical word lines respectively corresponding to addresses generated by processing a least significant bit (LSB) of the first critical address as "Don't care," and
wherein the target refresh control block configured to simultaneously refresh the second critical word lines respectively corresponding to addresses generated by processing a least significant bit (LSB) of the second critical address as "Don't care".

* * * * *